United States Patent
Park et al.

(10) Patent No.: US 9,553,083 B2
(45) Date of Patent: Jan. 24, 2017

(54) APPARATUS FOR CONTROLLING HEAT FLOW

(71) Applicants: SAMSUNG ELECTRONICS CO., LTD., Suwon-si (KR); SNU R&DB FOUNDATION, Seoul (KR)

(72) Inventors: Yeonsang Park, Seoul (KR); Byoungho Lee, Seoul (KR); Sungwoo Hwang, Seoul (KR); Younggeun Roh, Seoul (KR); Changwon Lee, Hwaseong-si (KR)

(73) Assignees: SAMSUNG ELECTRONICS CO., LTD., Suwon-Si (KR); SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/804,830

(22) Filed: Jul. 21, 2015

(65) Prior Publication Data
US 2016/0020202 A1   Jan. 21, 2016

(30) Foreign Application Priority Data

Jul. 21, 2014   (KR) .................. 10-2014-0092159

(51) Int. Cl.
*H01L 23/34*   (2006.01)
*H01L 27/02*   (2006.01)
*H01L 23/373*   (2006.01)

(52) U.S. Cl.
CPC ......... *H01L 27/0248* (2013.01); *H01L 23/373* (2013.01); *H01L 23/3733* (2013.01); *H01L 23/3738* (2013.01); *H01L 2924/0002* (2013.01)

(58) Field of Classification Search
CPC ............. H01L 23/3733; H01L 27/0251; H01L 23/3737

USPC .......................................................... 257/712
See application file for complete search history.

(56) References Cited

U.S. PATENT DOCUMENTS

| 8,178,153 B2 | 5/2012 | Feger et al. |
| 2009/0139244 A1* | 6/2009 | Ullo ........................ F25B 21/02 62/3.6 |
| 2012/0001200 A1* | 1/2012 | Ikoshi .................... H01L 23/295 257/77 |

FOREIGN PATENT DOCUMENTS

| JP | 4927571 B2 | 5/2012 |
| JP | 2013-21147 A | 1/2013 |
| KR | 10-0416993 B1 | 2/2004 |
| KR | 10-0964186 B1 | 6/2010 |

OTHER PUBLICATIONS

C. W. Chang et al.; "Solid-State Thermal Rectifier"; Science; vol. 314; Nov. 17, 2006; 6 pages total; DOI: 10.1126/science.1132898.
Martin Maldovan; "Narrow Low-Frequency Spectrum and Heat Management by Thermocrystals"; Physical Review Letters; American Physical Society; vol. 110; 2013; 5 pages total; DOI: 10.1103/PhysRevLett.110.025902.

* cited by examiner

*Primary Examiner* — Luan C Thai
(74) *Attorney, Agent, or Firm* — Sughrue Mion, PLLC

(57) ABSTRACT

An apparatus configured to control a heat flow is provided. The apparatus may include a semiconductor device region formed in a matrix; a heat rectifier region formed adjacent to the semiconductor device region; and a heat flow blocker formed in at least one region contacting the semiconductor device region and the heat rectifier region.

10 Claims, 5 Drawing Sheets

APPARATUS FOR CONTROLLING HEAT FLOW

CROSS-REFERENCE TO RELATED APPLICATION

This application claims priority from Korean Patent Application No. 10-2014-0092159, filed on Jul. 21, 2014, in the Korean Intellectual Property Office, the disclosure of which is incorporated herein in its entirety by reference.

BACKGROUND

1. Field

Apparatuses consistent with the exemplary embodiments relate to apparatuses capable of controlling a flow of heat in a semiconductor device.

2. Description of the Related Art

Heat which is in a solid medium may be transferred according to a heat conduction phenomenon. A heat conduction phenomenon may be a phenomenon in which the vibration of a phonon which is in a medium is transferred. The heat conductivity of a specific material may have a constant value. Materials which are present in a natural system, for example, are natural materials, have a limited value for heat conductivity.

Materials which have various and specific properties are developed by different material industries In particular, research into a meta material is being conducted. A meta material is made through an artificial process, and a meta material means that a property of a material is designed to have a desired characteristic. Research in meta materials is mainly conducted in terms of light and an acoustic wave. Research has been conducted with respect to a material having an acoustic refraction characteristic that is not present in nature or a cloaking phenomenon that visually blocks a specific region externally.

SUMMARY

Exemplary embodiments provide apparatuses capable of controlling a flow of heat generated in a semiconductor device in a desired direction.

Exemplary embodiments provide apparatuses capable of controlling a heat flow by using a phonon crystalline structure and a heat rectifier capable of controlling the flow of heat.

Additional aspects of the exemplary embodiments will be set forth in part in the description which follows and, in part, will be apparent from the description, or may be learned by practice of the presented exemplary embodiments.

According to an aspect of an exemplary embodiment, an apparatus capable of controlling a heat flow is provided. The apparatus includes a semiconductor device region formed in a matrix; a heat rectifier region formed adjacent to the semiconductor device region; and a heat flow blocker formed in at least one region contacting the semiconductor device region and the heat rectifier region.

The heat flow blocker may include internal materials distributed in a matrix material layer.

The internal materials may be formed to have a periodic arrangement in the matrix material layer at a gap of one of $\lambda/4$, $\lambda/2$, $\lambda$, or $\lambda 2$ according to the following equation, $$\lambda = v/f_{phonon}$$

wherein v denotes a spread speed of a phonon in the matrix material layer and $f_{phonon}$ denotes a vibration frequency of the phonon.

The matrix material layer can be formed of a material which has a different heat conductivity than the internal materials.

The matrix material layer may be formed of one of silicon (Si), gallium (Ga), arsenic (As) or a gallium arsenic compound (GaAs).

A region in which the internal materials are formed may be a region formed of an insulating material or a void region.

The heat rectifier region may be formed by bonding carbon nanotubes which have different diameters.

A first end portion of the heat rectifier region may contact the semiconductor device region, and the apparatus may further include a heat waveguide region formed in a second end portion of the heat rectifier region.

A first end portion of the heat rectifier region may contact the semiconductor device region, and a second end portion of the heat rectifier region may be exposed to an external area.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
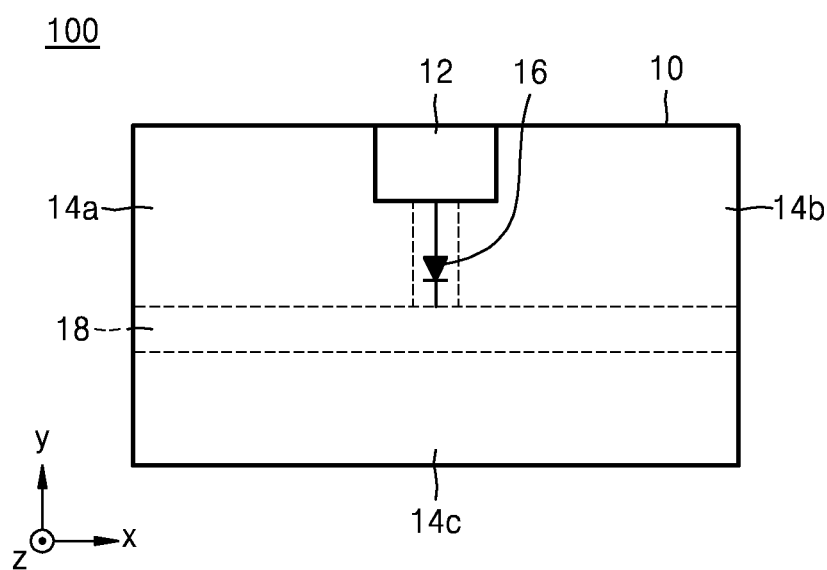
FIG. 1 is a diagram of an apparatus for controlling a heat flow according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. In the drawings, widths or thicknesses of layers or areas illustrated in the attached drawings may be exaggerated for clarity of the specification. Throughout the specification, like reference numerals denote like elements. In addition, unless explicitly described to the contrary, the word "comprise" and variations such as "comprises" or "comprising", will be understood to imply the inclusion of stated elements but not the exclusion of any other elements.

FIG. 1 is a diagram of an apparatus 100 for controlling a heat flow according to an exemplary embodiment.

Referring to FIG. 1, the apparatus 100 for controlling the heat flow may include a semiconductor device region 12 formed in a matrix 10 and a heat rectifier region 16 formed so as to be adjacent to the semiconductor device region 12. Heat flow blockers 14a, 14b, and 14c that limit or block the heat flow may be formed in at least one region which contacts the semiconductor device region 12 or which contacts the heat rectifier region 16 in the matrix 10 of the apparatus 100 for controlling the heat flow. The apparatus 100 for controlling the heat flow may include a heat waveguide region 18 that is not limited to controlling the heat flow. The heat rectifier region 16 of the apparatus 100 for controlling the heat flow may have one end portion which contacts the semiconductor device region 12 and another end portion which contacts the heat waveguide region 18 or is exposed externally or to the outside of the apparatus 100.

The semiconductor device region 12 may be a heat source region in which heat is generated, and may be a protection region which is protected from an external heat source so that the semiconductor device region 12 is not affected by external heat. A type of a semiconductor device which is formed in the semiconductor device region 12 is not limited to a particular type and may be a switching device such as a transistor, a diode, etc. or a light emitting device such as a light emitting diode or a light receiving device. The semiconductor device may be a memory device that may store information, however, this is merely an example and the semiconductor device can be other various types of devices. The semiconductor device region 12 may be a device including a semiconductor material layer formed through semiconductor processing in the matrix 10 such as a silicon substrate and having an electrode wiring structure. The semiconductor device region 12 may include a circuit or a system including various semiconductor devices.

The heat flow blockers 14a, 14b, and 14c are regions formed to artificially block the heat flow in the matrix 10 and may include phonon crystalline structures formed at a period which is formed by a predetermined gap. The phonon crystalline structure may include an internal material formed by a predetermined gap in the matrix 10. This will be described with reference to FIG. 2 below.

Figure 2:
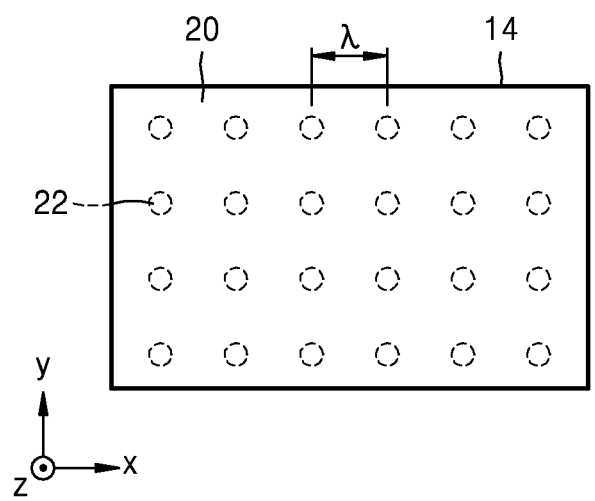
FIG. 2 is a diagram of a phonon crystalline structure of an apparatus for controlling a heat flow according to an exemplary embodiment.

FIG. 2 is a diagram of a phonon crystalline structure of an apparatus for controlling a heat flow according to an exemplary embodiment. Referring to FIG. 2, a heat flow blocker 14 may have a structure which includes internal materials 22 formed by a gap of a crystalline period λ in a material layer of a matrix 20. The crystalline period λ may be satisfied with equation 1 below.

$$\lambda = v/f_{phonon} \quad \text{[Equation 1]}$$

v of equation 1 above denotes a spread speed of a phonon in a material of the matrix 20, and $f_{phonon}$ denotes a vibration frequency of the phonon. The spread speed of the phonon may be determined based on a type of a background material, i.e. the material of the matrix 20. In a heat transfer phonon, the vibration frequency of the phonon may have a value of a wide range of band THz. According to equation 1, the internal materials 22 are formed to have the same size and gap as the wavelength of the phonon in the material of the matrix 20, and thus spread of the phonon having a specific vibration frequency may be inhibited. That is, the internal materials 22 are formed in accordance with the vibration frequency of the phonon that transfers heat in the matrix 20, thereby reducing or preventing a heat transfer phenomenon in the matrix 20.

The material layer of the matrix 20 may be formed of a semiconductor material such as silicon (Si), gallium (Ga), arsenic (As) or a gallium arsenic compound (GaAs). The internal materials 22 may be formed of a material which has a different heat conductivity from that of a material forming the material layer of the matrix 20, may be formed of an insulating material or may be a void region that is an empty space in the matrix 20. The internal materials 22 may be formed having a periodicity at a gap or an interval λ in the matrix 20. The internal materials 22 may also be formed at a gap λ/4, λ/2, or λ2 in the matrix 20. Although the internal materials 22 are formed in the matrix 20 with respect to a plane x-y in FIG. 2, the internal materials 22 may be formed at the gap λ/4, λ/2, λ, or λ2 in a z direction 3-dimensionally. Heat may be transferred in a solid medium such as the material of the matrix 20 according to a heat conduction phenomenon, which means that available energy of a phonon formed in a medium is transferred. If the internal materials 22 are formed to have the periodicity at the gap λ/4, λ/2, λ, or λ2 in the matrix 20, the existence of a phonon that mediates a heat transfer may be prevented, and as a result, the heat flow blockers 14a, 14b, 14c, and 14 of FIGS. 1 and 2 may limit or prevent the heat transfer phenomenon.

Referring to FIG. 1, the apparatus 100 for controlling the heat flow may include the heat rectifier region 16 formed adjacent to the semiconductor device region 12. The heat rectifier region 16 is a region in which a heat conductivity differs according to a conduction direction. The heat rectifier region 16 is a region for limiting a flow direction of heat generated in the semiconductor device region 12 and may move the heat generated in the semiconductor device region 12 of FIG. 1 in a direction of the heat waveguide region 18 while the heat rectifier region 16 is a region for preventing heat of the heat waveguide region 18 from conducting to the semiconductor device region 12. An example of the heat rectifier region 16 will be described with reference to FIG. 3 below.

Figure 3:
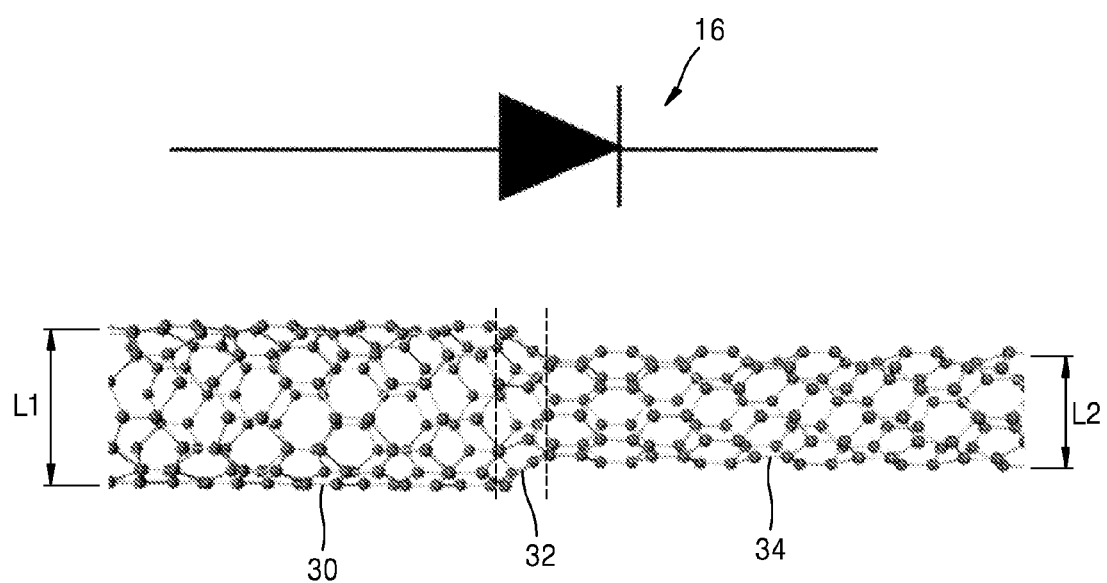
FIG. 3 is a diagram of an example of a heat rectifier region of an apparatus for controlling a heat flow according to an exemplary embodiment.

FIG. 3 is a diagram of an example of the heat rectifier region 16 of the apparatus 100 for controlling a heat flow according to an exemplary embodiment. Referring to FIGS. 1 and 3, the heat rectifier region 16 may be formed by bonding, for example, carbon nanotubes 30 and carbon nanotubes 34 having different diameters L1 and L2 and a bonding region 32. Vibration numbers of phonons that may be present at both sides of the bonding region 32 may be determined according to the diameters L1 and L2 of the carbon nanotubes 30 and the carbon nanotubes 34. As such, an asymmetrical bonding of the carbon nanotubes 30 and the carbon nanotubes 34 may enable phonons to be transferred in either direction while limiting the phonons to be transferred in an opposite direction. The carbon nanotubes 30 and the carbon nanotubes 34 may be single or multi walled carbon nanotubes.

As described above, the apparatus 100 for controlling the heat flow according to the present exemplary embodiment may control flow directions of heat generated in the semiconductor device region 12 and heat generated outside of the semiconductor device region 12 by using the heat flow blocker 14 and the heat rectifier region 16.

Figure 4:
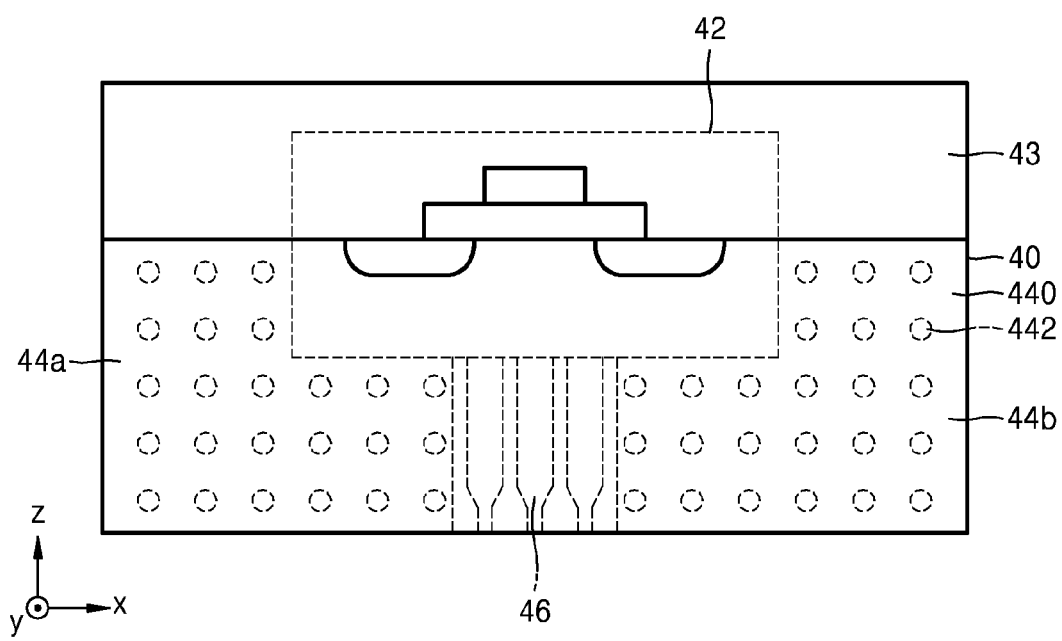
FIG. 4 is a diagram of an example of emitting heat, which is generated by a semiconductor device, externally by using a heat rectifier region in an apparatus for controlling a heat flow according to an exemplary embodiment.

FIG. 4 is a diagram of an example of emitting heat, which is generated by a semiconductor device, externally by using a heat rectifier region 46 in an apparatus for controlling a heat flow according to an exemplary embodiment.

Referring to FIG. 4, a semiconductor device region 42 and heat flow blockers 44a and 44b formed by contacting one end of the semiconductor device region 42 may be formed in a matrix 40. The heat rectifier region 46 may be formed in a lower portion of the semiconductor device region 42. The heat flow blockers 44a and 44b may include internal materials 442 periodically formed in a material layer 440 of the matrix 40. The material layer 440 of the matrix 40 may be formed of a semiconductor material such as silicon (Si), gallium (Ga), arsenic (As) or a gallium arsenic compound (GaAs). The internal materials 442 may be formed of an insulating material or may be a void region that is an empty space in the matrix 40. The semiconductor device region 42 may protrude externally of the apparatus 100. A capping layer 43 formed of the insulating material or a passivation material may be formed on the semiconductor device region 42. Heat generated from the semiconductor device region 42 may not be conducted to the heat flow blockers 44a and 44b but may be transferred downward by the heat rectifier region 46.

Figure 5:
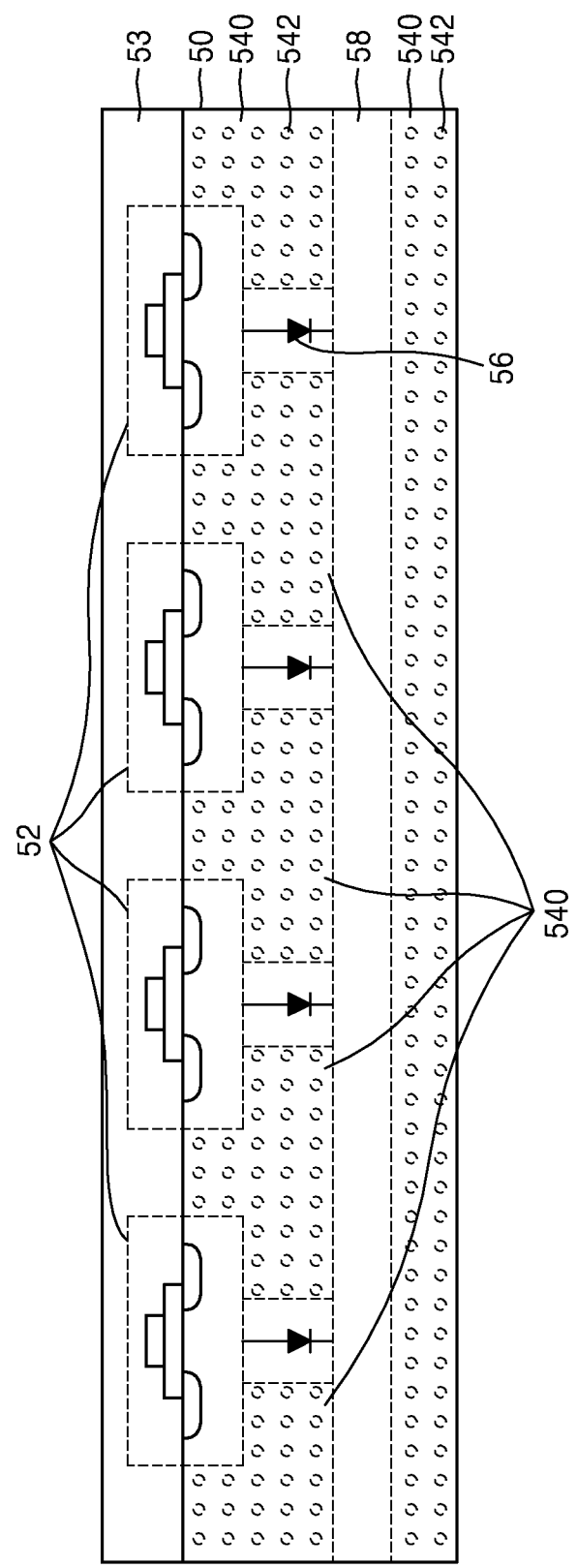
FIG. 5 is a diagram of an example of controlling a flow direction of heat generated from a plurality of semiconductor device regions by using the apparatus for controlling the heat flow of FIG. 4.

FIG. 5 is a diagram of an example of controlling a flow direction of heat generated from a plurality of semiconductor device regions 52 by using the apparatus for controlling the heat flow of FIG. 4.

Referring to FIG. 5, the plurality of semiconductor device regions 52 may be formed in a matrix 50, and heat flow blockers 540 and 542 may be formed around the semiconductor device regions 52. Heat rectifier regions 56 may be formed in a lower portion of the semiconductor device regions 52. The heat flow blockers 540 and 542 may include internal materials 542 periodically formed in a material layer 540 of a matrix 50. A capping layer 53 formed of an insulating material or a passivation material may be formed on the semiconductor device regions 52. The heat generated from the semiconductor device regions 52 may travel to a heat waveguide region 58 in a direction, for example, downward, through the heat rectifier regions 56, and may be emitted externally through the heat waveguide region 58. Heat present in the heat waveguide region 58 has difficulty in traveling to the semiconductor device regions 52 due to the heat rectifier regions 56, and thus a heat dissipation characteristic of the semiconductor device regions 52 may be improved.

As described above, according to one or more of the above exemplary embodiments, an apparatus for controlling a heat flow may control a flow of heat generated by a semiconductor device or in a specific region of a circuit or a system including the semiconductor device. The semiconductor device or a desired region of a circuit and a system including the semiconductor device may be protected from an external heat source.

Further, as described above, an exemplary embodiment provides a phonon crystalline structure which is capable of preventing heat from traveling in a medium.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the exemplary embodiments as defined by the following claims.

What is claimed is:

1. An apparatus configured to control a heat flow, the apparatus comprising:
    a semiconductor device region formed in a matrix;
    a heat rectifier region formed adjacent to the semiconductor device region; and
    a heat flow blocker formed in at least one region contacting the semiconductor device region and the heat rectifier region,
    wherein the heat flow blocker comprises internal materials distributed in a matrix material layer.

2. The apparatus of claim 1, wherein the internal materials are formed to have a periodic arrangement in the matrix material layer at a gap of one of $\lambda/4$, $\lambda/2$, $\lambda$, or $\lambda 2$ according to equation 1, $$\lambda = v/f_{phonon} \quad \text{[equation 1]}$$

wherein $v$ denotes a spread speed of a phonon in the matrix material layer and $f_{phonon}$ denotes a vibration frequency of the phonon.

3. The apparatus of claim 1, wherein the matrix material layer is formed of a material having a different heat conductivity than the internal materials.

4. The apparatus of claim 3, wherein the matrix material layer is formed of one of silicon (Si), gallium (Ga), arsenic (As) or a gallium arsenic compound (GaAs).

5. The apparatus of claim 3, wherein a region in which the internal materials are formed is a region formed of an insulating material or a void region.

6. The apparatus of claim 1, wherein the heat rectifier region is formed by bonding carbon nanotubes which have different diameters.

7. The apparatus of claim 1, wherein a first end portion of the heat rectifier region contacts the semiconductor device region, and wherein the apparatus further comprises a heat waveguide region formed adjacent to a second end portion of the heat rectifier region.

8. The apparatus of claim 1, wherein a first end portion of the heat rectifier region contacts the semiconductor device region, and a second end portion of the heat rectifier region is exposed to an external area.

9. The apparatus according to claim 7, further comprising a plurality of heat blockers which contact the semiconductor device region, the heat rectifier region, and the heat waveguide region.

10. An apparatus configured to control a heat flow of a semiconductor device, the apparatus comprising:
    a semiconductor device region formed in a matrix including the semiconductor device;
    a heat rectifier region formed adjacent to the semiconductor device region;
    a plurality of heat flow blockers which contact the semiconductor device region and the heat rectifier region,
    wherein the plurality of heat flow blockers comprise internal materials distributed in a matrix material layer.

* * * * *